US008965468B2

(12) United States Patent
Iwasa (10) Patent No.: US 8,965,468 B2
(45) Date of Patent: Feb. 24, 2015

(54) PERSISTENT-MODE HIGH-TEMPERATURE SUPERCONDUCTING SHIM COILS TO ENHANCE SPATIAL MAGNETIC FIELD HOMOGENEITY FOR SUPERCONDUCTING MAGNETS

(71) Applicant: Massachusetts Institute of Technology, Cambridge, MA (US)

(72) Inventor: Yukikazu Iwasa, Weston, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 287 days.

(21) Appl. No.: 13/660,415

(22) Filed: Oct. 25, 2012

(65) Prior Publication Data
US 2013/0102472 A1 Apr. 25, 2013

Related U.S. Application Data

(60) Provisional application No. 61/550,983, filed on Oct. 25, 2011.

(51) Int. Cl.
*H01F 6/06* (2006.01)
*G01R 33/385* (2006.01)
(Continued)

(52) U.S. Cl.
CPC ............... *G01R 33/035* (2013.01); *H01F 6/06* (2013.01); *G01R 33/3875* (2013.01); *G01R 33/3815* (2013.01)
USPC ........... 505/210; 505/162; 324/318; 324/320; 324/322; 335/216; 335/299

(58) Field of Classification Search
CPC ........... H01F 6/00; H01F 6/06; G01R 33/035; G01R 33/3575; G01R 33/3815; G01R 33/3806; G01R 33/34046; G01R 33/34023; A61B 5/055; H01L 39/126; H01L 39/143; H01L 39/24; H01L 39/2419
USPC ........... 505/162, 211; 324/318–322; 335/216, 335/299
See application file for complete search history.

(56) References Cited

U.S. PATENT DOCUMENTS 6,727,699 B2 * 4/2004 Kasten .......................... 324/318
6,894,418 B2 * 5/2005 Jones et al. .................... 310/208
(Continued)

FOREIGN PATENT DOCUMENTS

JP 2000-147082 * 5/2000 ......... G01R 33/3815
JP 2000147082 A 5/2000
(Continued)

OTHER PUBLICATIONS

Naoyuki Amemiya and Ken Akachi Magnetic field generated by shielding current in high Tc superconducting coils for NMR magnets; Superconductor Science and Technology; Supercond. Sci. Technol. 21 (2008) 095001 (7pp), Jun. 20, 2008.
(Continued)

*Primary Examiner* — Colleen Dunn
*Assistant Examiner* — Kallambella Vijayakumar
(74) *Attorney, Agent, or Firm* — Peter A. Nieves; Sheehan Phinney Bass + Green PA (57) ABSTRACT

A persistent-mode High Temperature Superconductor (HTS) shim coil is provided having at least one rectangular shaped thin sheet of HTS, wherein the thin sheet of HTS contains a first long portion, a second long portion parallel to first long portion, a first end, and a second end parallel to the first end. The rectangular shaped thin sheet of high-temperature superconductor has a hollow center and forms a continuous loop. In addition, the first end and the second end are folded toward each other forming two rings, and the thin sheet of high-temperature superconductor has a radial build that is less than 5 millimeters (mm) and able to withstand very strong magnetic field ranges of greater than approximately 12 Tesla (T) within a center-portion of a superconducting magnet of a superconducting magnet assembly.

22 Claims, 6 Drawing Sheets

(51) Int. Cl.
  *G01R 33/035* (2006.01)
  *H01L 39/24* (2006.01)
  *G01R 33/3875* (2006.01)
  *G01R 33/3815* (2006.01)

(56) References Cited

U.S. PATENT DOCUMENTS

| | | | | |
|---|---|---|---|---|
| 7,298,145 B2* | 11/2007 | Neufeld et al. | | 324/318 |
| 2004/0135659 A1* | 7/2004 | Schlenga et al. | | 335/299 |
| 2004/0212364 A1* | 10/2004 | Morita et al. | | 324/318 |
| 2007/0132455 A1* | 6/2007 | Rapoport et al. | | 324/320 |

FOREIGN PATENT DOCUMENTS

| | | | | |
|---|---|---|---|---|
| JP | 2004-325250 | * | 11/2004 | G01R 33/24 |
| JP | 20040325250 A | | 11/2004 | |
| JP | 2005-109144 | * | 4/2005 | H01F 6/06 |
| JP | 2005109144 A | | 4/2005 | |

OTHER PUBLICATIONS

Kiyoshi, Tsukasa et al; HTS-NMR: Present Status and Future Plan; IEEE Transactions on Applied Superconductivity, vol. 20, No. 3, Jun. 2010; pp. 714-717.

Hahn, Seungyong et al; Operation and performance analyses of 350 and 700 MHz low-/high-temperature superconductor nuclear magnetic resonance magnets: A march toward operating frequencies above 1 GHz; Journal of Applied Physics 105, 024501 (2009).

Hahn, Seungyong et al; Development of a 700 MHz low-/high-temperature superconductor nuclear magnetic resonance magnet: Test results and spatial homgeneity improvement; Review of Scientific Instruments 79, 026105 (2008).

Gu, Chen et al; Measurement and Calculation of Residual Magnetic Field in a Bi2223/Ag Magnet; IEEE Transactions on Applied Superconductivity, vol. 17, No. 2, Jun. 2007; pp. 2394-2397.

Lee, Haigun et al; An HTS Insert for Phase 2 of a 3-Phase 1-GHz LTS/HTS NMR Magnet; IEEE Transactions on Applied Superconductivity, vol. 15, No. 2, Jun. 2005, pp. 1299-1302.

Iwasa, Yukikazu et al; High-Temperature Superconducting Magnets for NMR and MRI: R&D Activities at the MIT Francis Bitter Magnet Laboratory; IEEE Transactions on Applied Superconductivity, vol. 20, No. 3, Jun. 2010; pp. 718-721.

Bascuñán, Juan et al; A 1.3-GHz LTS/HTS NMR Magnet—A Progress Report; IEEE Transactions on Applied Superconductivity, vol. 21; No. 3, Jun. 2011, pp. 2092-2095.

Bascuñán, Juan et al; An LTS/HTS NMR Magnet Operated in the Range 600-700 MHz; IEEE Transactions on Applied Superconductivity, vol. 17 pp. 1446 (2007).

Bascuñán, Juan et al; A Low- and High- Superconducting (LTS/HTS) NMR Magnet; Design and Performance Results, IEEE Transactions on Applied Superconductivity, vol. 13 pp. 1550 (2003).

Ahn, Min Cheol et al; Spatial and Temporal Variations of a Screening Current Induced Magnetic Field in a Double-Pancake HTS Insert of an LTS/HTS NMR Magnet; IEEE Transactions on Applied Superconductivity, vol. 19 pp. 2269 (2009).

Iwasa, Yukikazu; Case Studies in Superconducting Magnet, 2nd Edition, Springer, 2009.

Scott, Russell B.; Cryogenic Engineering (1953 Edition reprinted in 1988 by Met-Chem Research, Boulder, CO).

Y. Yanagisawa, H Nakagome, M. Hosono, M. Hamada, T. Kiyoshi, F. Hobo, M. Takahashi, T. Yamazaki, and H. Maeda, "Towards beyond-1GHz solution NMR: internal 2H-lock operation in an external current mode" J. Magn. Reson. 192, 329 (2008).

Y. Yanagisawa, H. Nakagome, K Tennmei, M. Hamada, M. Yoshikawa, A. Otsuka, M. Hosono, T. Kiyoshi, M. Takahashi, T. Yamazaki, and H. Maeda, "Operation of a 500 MHz high temperature superconductingNMR: towards an NMR Spectrometer operating beyond 1 GHz," J. Magn. Reson. 203, 274 (2010).

U.P. Trociewitz, M. Dalban-Canassy, M. Hannion, D.K Hilton, J. Jaroszynski, P. Noyers, Y. Viouchkov, H.W. Weijers, D.C. Larbalestier, "35.4 T field generated using a layer-wound superconducting coil made of (RE)Ba2Cu3O7-x (RE=rare earth) coated conductor," Applied Physics Letter 99, 202506 (2011).

Seung-yong Hahn, Min Cheol Ahn, Juan Bascunan, Weijun Yao, and Yukikazu Iwasa, "Nonlinear behavior of a shim coil in an LTS/HTSNMRmagnet with an HTS insert comprising double-pancake HTS-tape coils," IEEE Tran. Appl. Superconduc. 19, 2285 (2009).

Y. Koyama, T. Takao, Y. Yanagisawa, H. Nakagome, M. Hamada, T. Kiyoshi, M. Takahashi and H. Maeda, "Towards beyond 1GHz NMR: Mechanism of the long-term drift of screening currentinduced magnetic field in a Bi-2223 coi," Physica C 469[13], 694 (2009).

A. Miyazoe, M. Sekino, T. Kiyoshi, H. Ohsaki, "Magnetic field induced by screening current in short and straight coated conductors," IEEE Trans. Appl. Superconduc. 20, 1557 (2010).

Haigun Lee, Juan Bascunan, and Yukikazu Iwasa, "A high-superconducting double-pancake insert for an NMR magnet," IEEE Trans. Appl. Superconduc. 13, 1546 (2003).

Seung-yong Hahn, Juan Bascunan, Woo-Seok Kim, Emanuel S. Bobrov, Haigun Lee, and Yukikazu Iwasa, "Field mapping, NMR lineshape, and screening currents induced field analyses for homogeneity improvements in LTS/HTS NMR magnets," IEEE Tran. Appl. Superconduc. 18, 858 (2008).

* cited by examiner

PERSISTENT-MODE HIGH-TEMPERATURE SUPERCONDUCTING SHIM COILS TO ENHANCE SPATIAL MAGNETIC FIELD HOMOGENEITY FOR SUPERCONDUCTING MAGNETS

CROSS-REFERENCE TO RELATED APPLICATION

This application claims priority to U.S. Provisional application entitled, "PERSISTENT-MODE HIGH-TEMPERATURE SUPERCONDUCTING SHIM COILS TO ENHANCE SPATIAL MAGNETIC FIELD HOMOGENEITY FOR SUPERCONDUCTING NUCLEAR MAGNETIC RESONANCE (NMR) MAGNETS AND SUPERCONDUCTING MAGNETIC RESONANCE IMAGING (MRI) MAGNETS," having Ser. No. 61/550,983, filed Oct. 25, 2011, which is entirely incorporated herein by reference.

FIELD OF THE INVENTION

The present invention is generally related to superconducting magnets, and more particularly is related to enhancing spatial magnetic field homogeneity for superconducting magnets through use of shim coils.

BACKGROUND OF THE INVENTION

Providing optimal imaging when using superconducting magnets requires a very uniform magnetic field. Unfortunately, presently it is near impossible to provide a perfectly uniform magnetic field so as to provide a homogeneous field over a sample volume. In fact, one of the key design and operational issues for superconducting magnets is the magnet's spatial field homogeneity. As an example, for a high-resolution Nuclear Magnetic Resonance (NMR) superconducting magnet, its field must be uniform with errors limited to ~0.01 ppm over, typically, a spherical volume of diameter of 10 mm, within which a sample is placed. In addition, for a whole-body Magnetic Resonance Imaging (MRI) magnet, this spherical volume of diameter can be 20-30 cm.

Field shimming is an essential process used in, for example, superconducting NMR and superconducting MRI magnets, to create a spatially homogeneous field over the sample volume. Present field shimming generally relies on fields generated by two types of coils, superconducting and copper, and by ferromagnetic (steel) material. A superconducting NMR magnet is generally equipped with its own set of superconducting shim coils, currently wound with Niobium-Titanium (NbTi), which is a low-temperature superconductor (LTS). Due to their field limitations (<12 Tesla (T) even at 1.8 Kelvin (K)) and radial build typically of 15-30 mm, NbTi shims are located in an annular space outside of magnetic assemblies, specifically, radially furthest away from a magnet center where the sample is placed.

Figure 1:
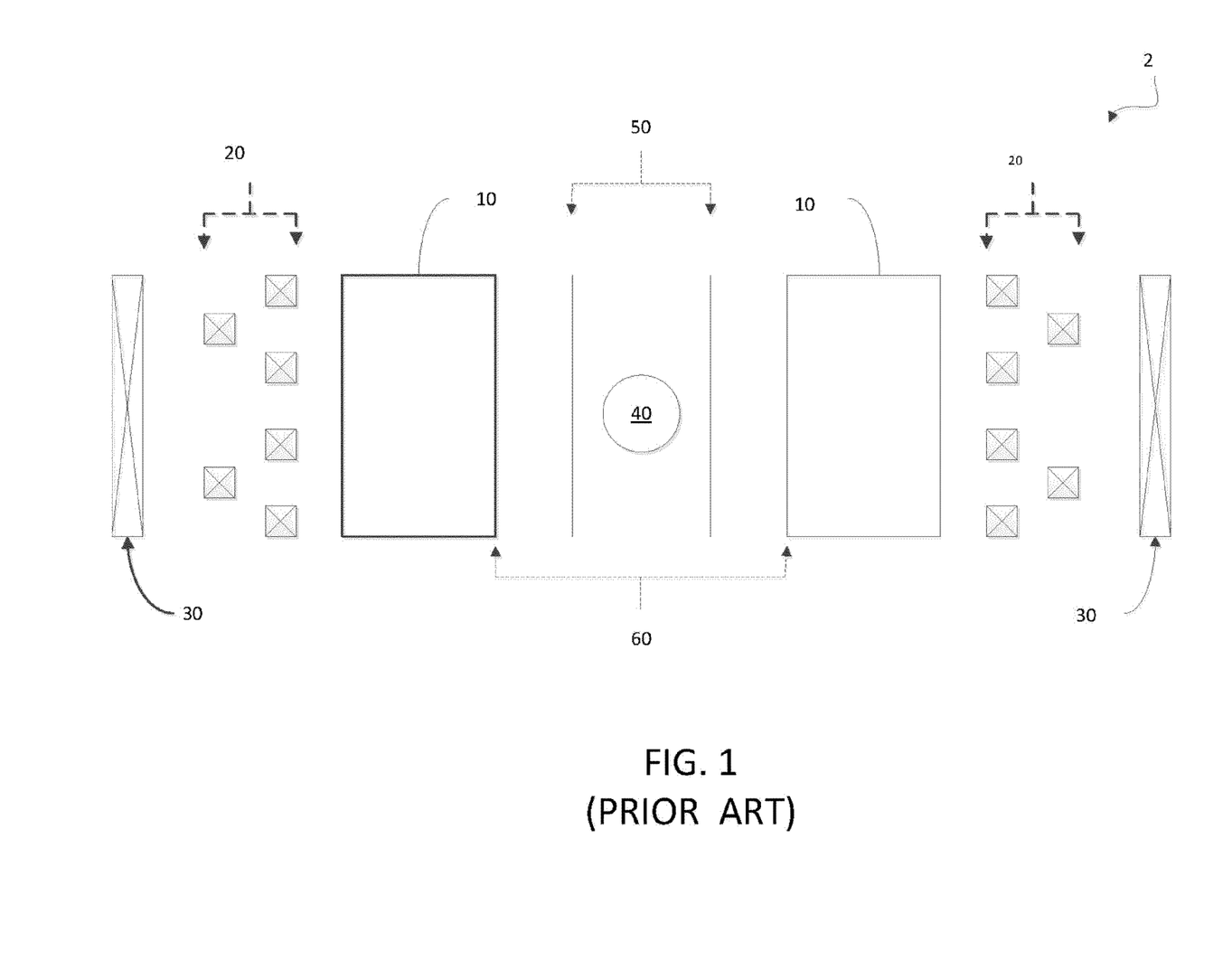
FIG. 1 is a schematic diagram illustrating an exemplary prior art NMR magnet assembly.

FIG. 1 is a schematic diagram illustrating an exemplary prior art NMR magnet assembly 2. As shown by FIG. 1, the assembly 2 contains a superconducting NMR magnet 10, corrective coils 20, and conventional exterior superconducting shims 30. As previously mentioned, the conventional exterior superconducting shims are typically NbTi shims. A sample, to be imaged by the assembly 2, is placed within a bore 50, where the bore 50 is located within the NMR magnet 10. The location within the NMR magnet 10 is typically referred to as a premium high-field region 60 of the superconducting magnet. The sample is located within a detection region 40 of the assembly 2, which is typically a 10-mm Diameter Spherical Volume (DSV) established for the sample.

Conventional NbTi shim sets 30 are placed outside of the main magnet, because: 1) an annular space within the main magnet has always been considered better utilized to generate the main field, rather than to improve the efficiency of a shim set; and 2) NbTi shim sets cannot generally be operated in a higher-field region of the main magnet, which is located closer to the center, within the premium high-field region of the superconducting magnet.

Unfortunately, there are inherent technical disadvantages for a shim placed outside of the main magnet and the correction coils. At a great distance the shim must work much harder (i.e., more ampere turns) to generate a required shimming field. One prominent source of field errors is a screening-current field (SCF), also referred to as a diamagnetic field, generated by each coil in a superconductor magnet assembly. The diamagnetic fields generated by the coils create diamagnetic walls that are proportional to the superconductor size and critical current density. The shim field is not only attenuated, but also distorted when it penetrates through these diamagnetic walls to reach the center of the superconducting magnet. In addition, the field attenuation is asymmetric in the axial (z) direction.

Therefore, there is a need to provide a more spatially homogeneous field over a sample volume in the superconducting magnet.

SUMMARY OF THE INVENTION

Embodiments of the present invention provide persistent-mode high-temperature superconducting shim coils for enhancing spatial magnetic field homogeneity for superconducting magnets, as well as a superconducting magnet assembly having at least one HTS shim coil therein. Briefly described, in architecture, one embodiment of the present invention, among others, can be implemented as follows. A persistent-mode High Temperature Superconductor (HTS) shim coil is provided having at least one rectangular shaped thin sheet of HTS, wherein the thin sheet of HTS contains a first long portion, a second long portion parallel to first long portion, a first end, and a second end parallel to the first end. The rectangular shaped thin sheet of high-temperature superconductor has a hollow center and forms a continuous loop. In addition, the first end and the second end are folded toward each other forming two rings, and the thin sheet of high-temperature superconductor has a radial build that is less than 5 millimeters (mm) and able to withstand very strong magnetic field ranges of greater than approximately 12 Tesla (T) within a center-portion of a superconducting magnet of a superconducting magnet assembly.

A superconducting magnet assembly is also provided having at least one persistent-mode HTS shim coil therein. The assembly contains at least one superconducting magnet for providing very strong magnetic field ranges of greater than approximately 12 Tesla (T) within a center-portion of the superconducting magnet, at least one corrective coil, and the persistent-mode HTS shim coil being located within a center-portion of the superconducting magnet. The persistent-mode HTS shim coil has at least one rectangular shaped thin sheet of HTS, wherein the thin sheet of HTS contains a first long portion, a second long portion parallel to first long portion, a first end, and a second end parallel to the first end. The rectangular shaped thin sheet of high-temperature superconductor has a hollow center and forms a continuous loop. In addition, the first end and the second end are folded toward each other forming two rings, and the thin sheet of high-temperature superconductor has a radial build that is less than 5 millimeters (mm) and able to withstand very strong magnetic field ranges of greater than approximately 12 Tesla (T) within a center-portion of the superconducting magnet of the superconducting magnet assembly.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

The present invention provides persistent-mode high-temperature superconducting shim coils for enhancing spatial magnetic field homogeneity for superconducting magnets, as well as providing superconducting magnet assemblies containing such superconducting shim coils. The introduced superconducting shim coils have high-field capability and a slim radial build. High-temperature superconductor (HTS) shim coils of the present invention are particularly suitable to high-field LTS/HTS NMR magnets. The high-field capability and slim radial build enable the present HTS shims coils to be placed within a premium high-field region of a superconducting magnet assembly previously reserved only for the winding of the main magnet. Because a typical critical temperature of HTS is above liquid nitrogen temperatures (65-77 K), the HTS shim coils may be used in a superconducting magnet that operates above liquid helium temperatures (below 4.5 K). This is unlike conventional NbTi shim coils, which operate only in liquid helium temperatures.

The following detailed description provides the example of the superconducting magnets being NMR or MRI magnets, however, one having ordinary skill in the art would appreciate that other superconducting magnets may be supplemented. The present invention is not limited to NMR and MRI magnet assemblies.

The persistent-mode HTS shim coil of the present invention (referred to hereinafter as, "the HTS shim") may be a Z1 HTS shim coil and higher odd numbers (e.g., Z3, Z5, Z7), a Z2 HTS shim coil and higher even numbers (e.g., Z4, Z6, Z8), an X HTS shim coil, or an HTS shim coil of a different configuration. Referring first to a simplest Z1 HTS shim coil, the HTS shim coil begins as a rectangular loop cut from a high-temperature superconductor. As an example, the rectangular loop may be cut from an HTS sheet having a layer of a rare earth metal combined with Barium Copper Oxide (BCO). One specific example is an Yttrium Barium Copper Oxide (YBCO) coated roll-assisted-biaxially-textured-substrates (RABiTS) tape. Specifically, rectangular loops are cut from a wide YBCO coated superconductor. An example of such a YBCO coated superconductor may be one currently manufactured by American Superconductor Corporation (AMSC) of Devens, Mass. Such a YBCO coated superconductor uses RABiTS substrate and deposits YBCO layer thereon. It should be noted that the present HTS shim coil may instead be made of Gadolinium or any other rare earth metal that when combined with other materials become a high-temperature superconductor having the characteristics described in the present description.

It should be noted that the present invention is not limited to a persistent-mode HTS shim coil made of YBCO. Instead, the HTS shim coil may be constructed from a thin sheet of a different high-temperature superconductor and being able to withstand very strong fields within the premium high-field region of a superconducting magnet assembly.

Figure 2:
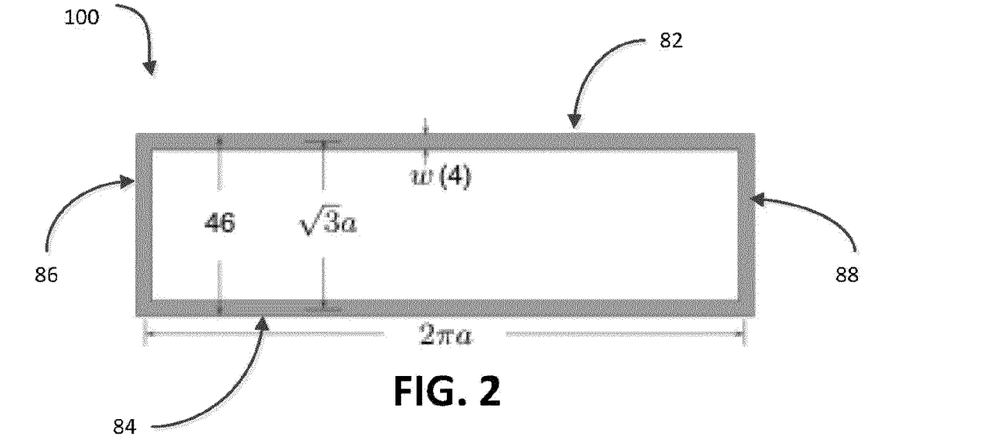
FIG. 2 is a schematic diagram illustrating an example of a rectangular loop, which is a key component used to create the HTS shim coil.

FIG. 2 is a schematic diagram illustrating an example of a rectangular loop 100 used to create the HTS shim coil. As illustrated, the rectangular loop 100 is a continuous loop. For exemplary purposes, the tape is coated with a YBCO film that may be ~1 μm thick and the tape may be 80 μm thick overall. It should be noted the radial build of the present HTS shim coil is less than 5 mm, and preferred to be ~1 mm or less. In addition, the present HTS shim coil is capable of operating in a magnetic field range that is above approximately 12 Tesla (T). Further, the HTS shim coil can operate in a temperature range of greater than 10 Kelvin (K).

Being a rectangular loop 100, the beginning structure of the HTS shim coil contains a first long portion 82, a second long portion 84 parallel to first long portion 82, a first end 86, and a second end 88 parallel to the first end. Odd number shims (Z1, Z3, . . . ) are basically "anti-Helmholtz" coils, while even number shims (Z2, Z4, . . . ) are Helmholtz coils. For a Z1 shim having two rings, each of diameter $2a$, the distance between the rings is $\sqrt{3}a$, or $\sqrt{3}$ multiplied by the radius of the ring. For exemplary purposes, FIG. 2 shows that the rectangular loop is 46 mm high in the z direction and $2\Pi a+w$ long in the azimuthal (A) direction. It should be noted that to generate a greater gradient (Z1) field, it is generally necessary to use multiple turns in each ring.

It should be noted that in a Z1 shim coil, or for that matter in any shim coil, there are other unwanted higher or lower order fields. Therefore, a Z1 shim coil generates not only a Z1 field, which is desirable, but also Z3, Z5, Z7 . . . fields, which are all undesirable. In the case of a Z1 shim, if the distance between two loops is the square root of 3 times the radius of the loop, then "theoretically" there is no Z3 field, however there is a large Z5 field. Therefore, except for a 2-loop Z1 shim coil, several loops may be required to maximize the particular shim field (Z1 field for a Z1 shim) and minimize other fields.

Figure 3:
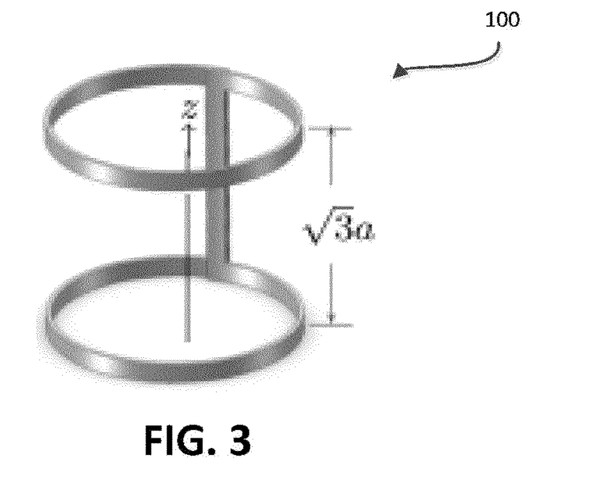
FIG. 3 is a schematic diagram illustrating the rectangular loop (Z1 shim) of FIG. 2 after folded to bring the two ends of the rectangular loop together, approximating a Z1 shim coil of two rings.
Figure 4:
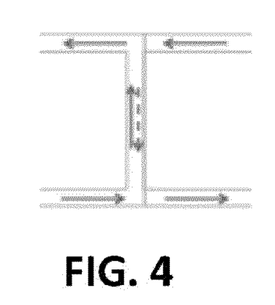
FIG. 4 is a schematic diagram illustrating current directions in a rectangular loop when the ends of the rectangular loop are overlapping.

FIG. 3 is a schematic diagram illustrating the rectangular loop 100 (Z1 shim coil) of FIG. 2 after folding so as to bring the two ends 86, 88 of the rectangular loop together, approximating a Z1 shim coil of two rings. It should be noted that the two ends 86, 88 may be folded in one of two ways. A first way of folding includes overlapping, as illustrated by FIG. 3. FIG. 4 is a schematic diagram illustrating current directions in the loop when the ends of the rectangular loop are overlapping.

Figure 5:
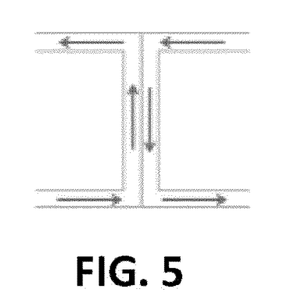
FIG. 5 illustrates a second way of folding the rectangular loop of FIG. 2 including folding to align the two ends side-by-side, so that the two vertical loop ends are aligned next to each other in the azimuthal direction.

A second way of folding the rectangular loop includes folding to align the two ends 86, 88 side-by-side, so that the two vertical loop ends are aligned next to each other in the azimuthal direction, an example of which is illustrated by the schematic diagram of FIG. 5. In either the overlapping or side-by-side arrangement, it is noted that the ±z directed current vectors are nearly cancelled.

Figure 6:
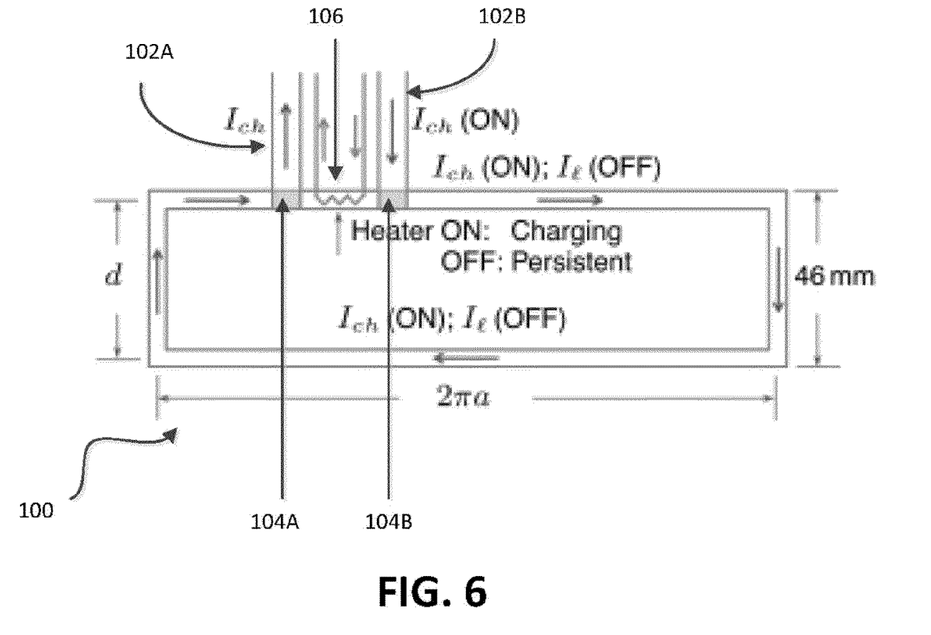
FIG. 6 is a schematic diagram illustrating a basic configuration used to energize a Z1 shim coil so as to make it superconducting.

For the Z1 shim coil to be placed in the premium high-field region of the superconducting magnet, the Z1 shim coil needs to be superconducting. FIG. 6 is a schematic diagram illustrating a basic configuration used to energize the Z1 shim coil 100 so as to make it superconducting. As shown by FIG. 6, a pair of current leads 102a, 102b, each of, for example, 4-mm wide AMSC YBCO tape, are soldered. The shaded areas in FIG. 6 are soldered joints 104a, 104b. A persistent-current switch (PCS) 106, needed by the HTS shim coil 100 for persistent-mode operation, is connected to the Z1 shim coil 100. With the heated part of the loop resistive (heater ON), the Z1 shim coil 100 may be charged, $I_{ch}$. When the heater 106 is turned OFF, the entire loop becomes superconducting, establishing a persistent-mode current, $I_p$, of the same amplitude, but in the opposite direction in the "top" and "bottom" coils, creating a Z1 field. The result is a persistent-mode shim coil field. FIG. 6 shows both charging and persistent-current modes. It should be noted that, in a multiple-loop HTS shim coil, with each loop having its own PCS, the PCS heater powers are adjusted to match the persistent-mode currents of all the loops.

Figure 7:
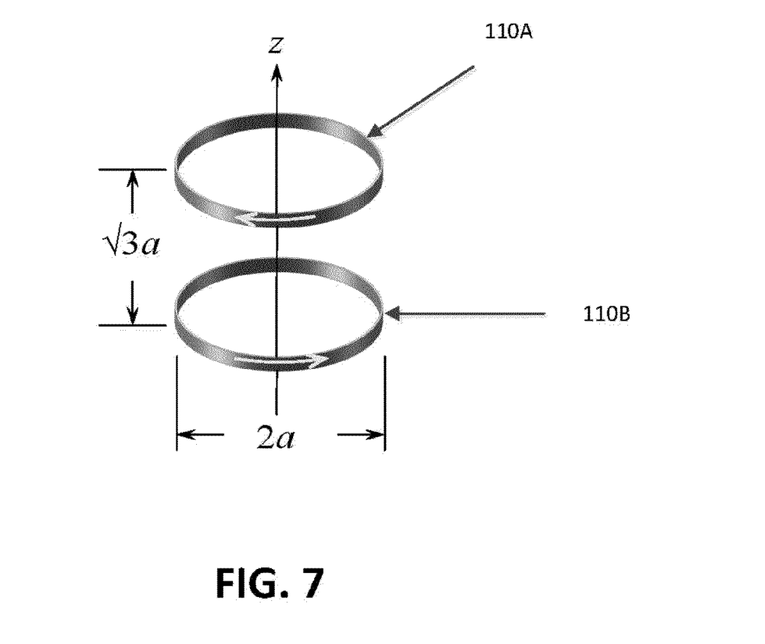
FIG. 7 is a schematic diagram illustrating the resulting superconducting Z1 shim coil and associated fields, after using the configuration of FIG. 6.

FIG. 7 is a schematic diagram illustrating the resulting superconducting Z1 shim coil 100 and associated fields. Specifically, due to cancellation of current in the overlapping or side-by-side aligned ends, the resulting superconducting shim coil 100 contains a top portion 110a having current traversing in one direction, and a bottom portion 110b having current traversing in an opposite direction from the top portion 110a. The resulting magnetic field is illustrated as z.

It should be noted that while FIG. 2 illustrates use of a single rectangle to build the present HTS shim coil, in accordance with an alternative embodiment of the invention, two or more rectangles may instead be used to build a larger diameter HTS shim coil. It should also be noted that a 2-ring configuration is the simplest form of the Z1 HTS shim coil. Generally, each ring of a Z1 HTS shim contains many turns, extending axially (turns/layer) and radially (layers).

Figure 8:
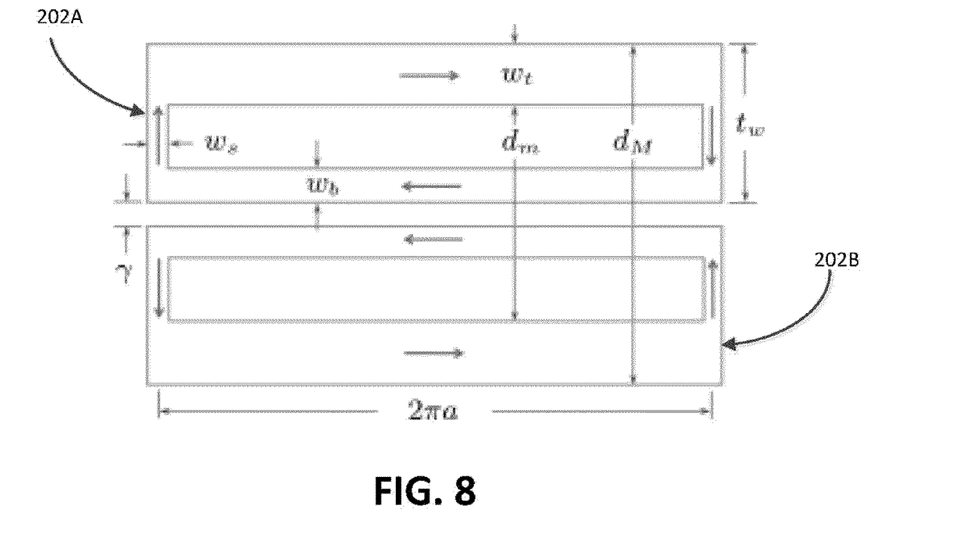
FIG. 8 is a schematic diagram illustrating a basic configuration for constructing Z2 and higher even HTS shim coils in accordance with the present invention.
Figure 9:
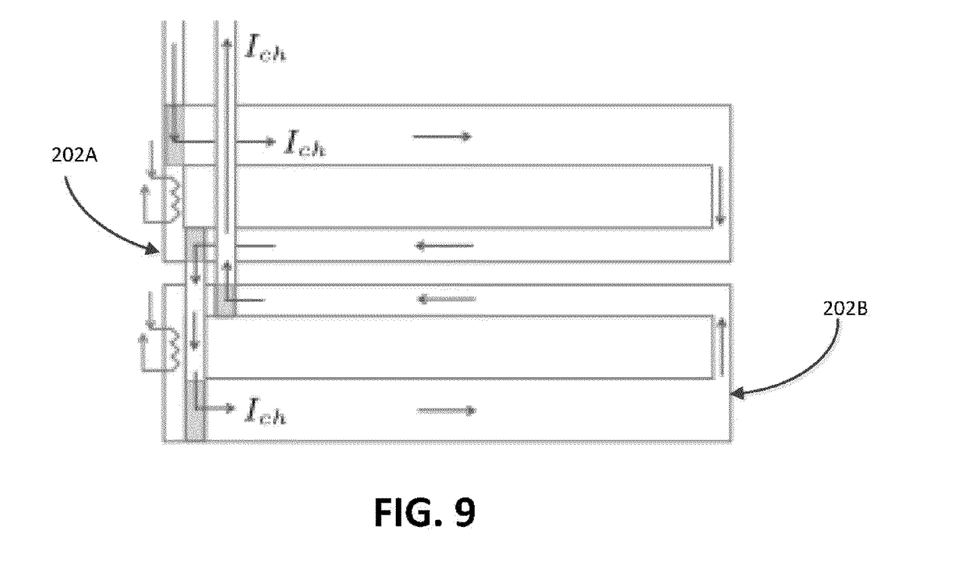
FIG. 9 is a schematic diagram illustrating charging of a Z2 shim coil composed of two loops, such as in FIG. 8.

The single-loop HTS shim coil of FIG. 3 and FIG. 4 is applicable only to Z1, Z3, . . . shim coils. A modified HTS shim coil is required for Z2, Z4, . . . shim coils, as described hereinafter, and as illustrated by FIG. 8. FIG. 8 is a schematic diagram illustrating a basic configuration for constructing Z2 and higher even HTS shim coils in accordance with the present invention. The HTS shim coil configuration of FIG. 8 contains two identical loops 202a, 202b, where the loops 202a, 202b are energized in opposite directions, the bottom loop 202b being flipped in the z axis. FIG. 9 is a schematic diagram illustrating a charging circuit for charging of a Z2 shim composed of two loops, such as the Z2 shim of FIG. 8. Components of the charging circuit for charging of the Z2 shim share similarity with the charging circuit of the Z1 shim in FIG. 6 and therefore are not described in detail herein since one having ordinary skill in the art would understand implementation based upon the charging circuit of FIG. 8. It should be noted that FIG. 9 illustrates how the two loops may be energized using one current source. One having ordinary skill in the art would appreciate that herein, more than one current source may be used where a single current source is illustrated.

Dimensions $t_w$ (tape width), $w_t$ (width of a top horizontal leg of the top loop 202a), $w_s$ (side leg width), $w_b$ (bottom leg width), and γ (the gap size between the bottom of the top loop 202a and the top of the bottom loop 202b), are adjustable parameters. This arrangement results in two Z2 shims, Z2O (outer shim) and Z2I (inner): Z2O shim of two outer legs each of width $w_t$ and Z2I shim of two inner legs each of width $w_b$.

For exemplary purposes, the following considers two arrangements, although the present invention is not limited to these arrangements, specifically, γ=0 and 34 mm, each with the following dimensions: $t_w$=46 mm; $w_s$=$w_b$=4 mm; $w_t$=25 mm; and a=38 mm. These two shims are merely examples out of the many possibilities with the five variables ($w_s$, $w_t$, $w_b$, γ, and $t_w$) to design optimal shims. It should be noted that if the current polarity of the bottom loop 202b is reversed, the result is odd HTS shims.

One significance of the present HTS shim, as previously mentioned, is the ability to operate in the field ranges of >~12 T and the temperature range of >10K, both of which are beyond prior art shims, such as, NbTi shims. In addition, the present HTS shim contains radial builds that are thinner than those of prior art shim coils, namely <5 mm as opposed to the prior art >15 mm. Further the combination of the present HTS shim features enables the present HTS shim to be placed inside the magnet assembly, within the premium high-field region of the superconducting magnet assembly, thereby being closer to the sample volume and immune to detrimental diamagnetic wall effects. The present HTS shim also can operate liquid-helium (LHe) free, and more significantly at above LHe temperatures.

Figure 10:
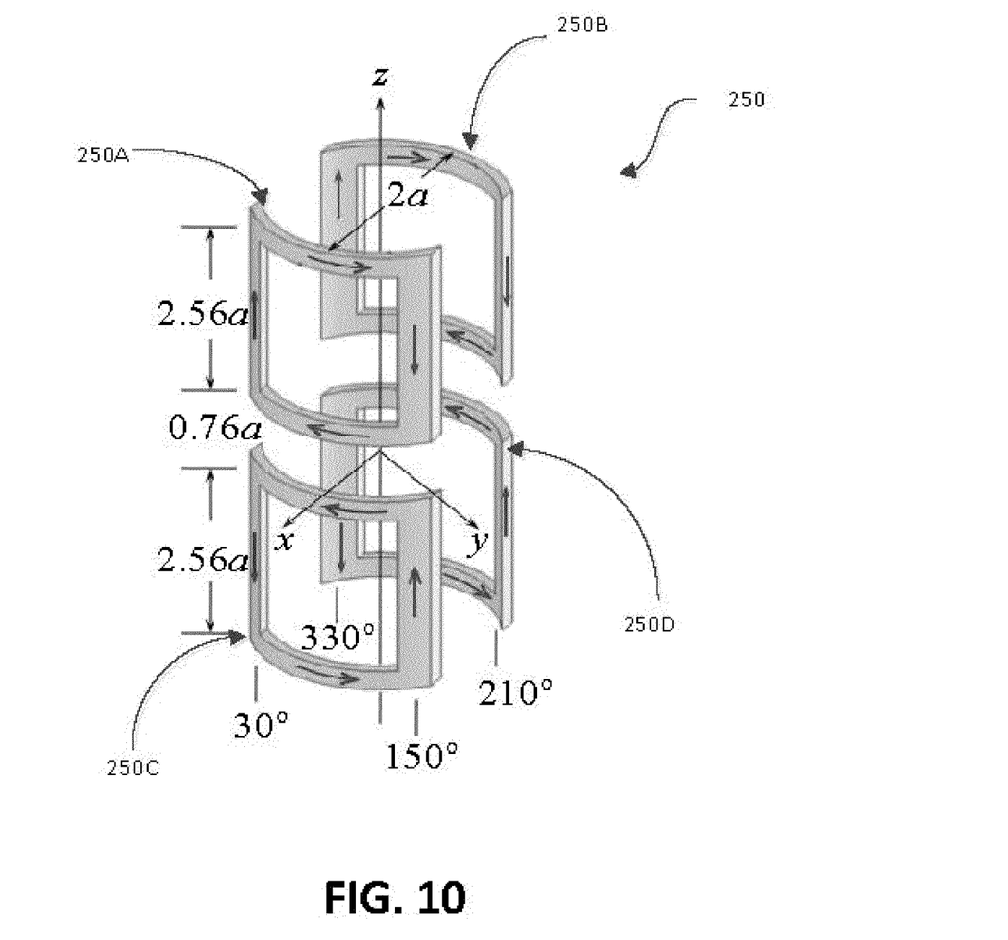
FIG. 10 is a schematic diagram illustrating configuration of an X HTS shim coil in accordance with the present invention.

As previously mentioned, the persistent-mode HTS shim of the present invention may also be an X HTS shim coil. FIG. 10 is a schematic diagram illustrating configuration of an X HTS shim coil 250 in accordance with the present invention. To construct the X shim coil 250 wide YBCO tape may be cut into each of four illustrated square loops 250a, 250b, 250c, 250d. The four loops can be connected in series, and energized simultaneously. It should be noted that the X shim of FIG. 10 requires four heated sections for the entire 4-series connected loops to be energized.

Figure 11:
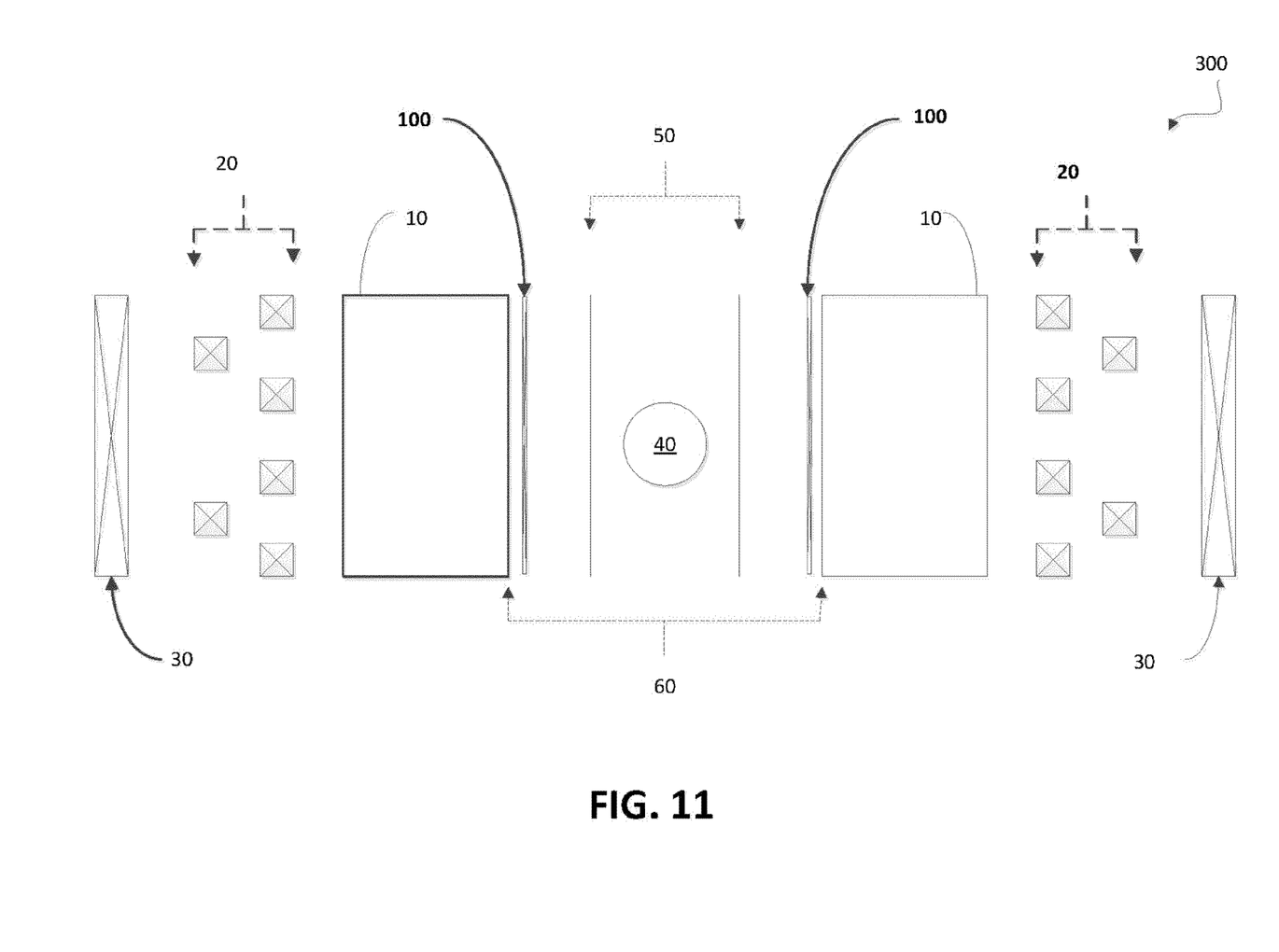
FIG. 11 is a schematic diagram illustrating an NMR magnet assembly in accordance with the present invention, which contains HTS shim coils of the present invention.

FIG. 11 is a schematic diagram illustrating an NMR magnet assembly 300 in accordance with the present invention, which contains HTS shim coils of the present invention. As shown by FIG. 11, the assembly 300 contains a superconducting NMR magnet 10, corrective coils 20, and conventional prior art exterior shims 30. As previously mentioned, the conventional exterior superconducting shims are typically NbTi shims. The sample, to be imaged by the assembly 300, is placed within the bore 50, where the bore 50 is located within the NMR magnet 10.

As previously mentioned, the location within the NMR magnet 10 is typically referred to as a premium high-field region 60 of the superconducting magnet. The persistent-mode HTS shim 100 of the present invention is placed within the premium high-field region 60. The sample is then located within the detection region 40 of the assembly 300, which is located within the persistent-mode HTS shim 100, which is, in turn, located within the superconducting NMR magnet 10.

It should be noted that the present assembly 300 may have more or fewer components. As an example, additional or fewer corrective coils 20 may be located within the assembly 300. In addition, no corrective coils 20 may be used within the assembly. Further additional or fewer conventional prior art exterior shims 30 may be located within the assembly, or no such shims 30 may be used. Still further, additional superconducting magnets may be located within the assembly 300.

It should be emphasized that the above-described embodiments of the present invention are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

I claim:

1. A persistent-mode High Temperature Superconductor (HTS) shim coil, comprising at least one rectangular shaped thin sheet of HTS having:
    a first long portion;
    a second long portion parallel to the first long portion;
    a first end; and
    a second end parallel to the first end,
        wherein the rectangular shaped thin sheet of high-temperature superconductor has a hollow center and forms a continuous loop,
        wherein the first end and the second end are folded toward each other forming two rings, and
        wherein the thin sheet of high-temperature superconductor has a radial build that is less than 5 millimeters (mm) and able to withstand very strong magnetic field ranges of greater than approximately 12 Tesla (T) within a center-portion of a superconducting magnet of a superconducting magnet assembly.

2. The persistent-mode HTS shim coil of claim 1, wherein the rectangular thin sheet is a rare earth metal combined with Barium Copper Oxide (BCO).

3. The persistent-mode HTS shim coil of claim 2, wherein the rare earth metal is Yttrium.

4. The persistent-mode HTS shim coil of claim 1, further comprising a larger diameter HTS shim coil comprising more than one rectangular shaped thin sheet of HTS.

5. The persistent-mode HTS shim coil of claim 1, wherein the two rings each have a diameter of 2 multiplied by the radius of the ring and the distance between the rings is $\sqrt{3}$ multiplied by the radius of the ring.

6. The persistent-mode HTS shim coil of claim 1, wherein the first end and the second end overlap each other so that ±z directed current vectors are nearly cancelled.

7. The persistent-mode HTS shim coil of claim 5, wherein the two rings are energized in the opposite direction.

8. The persistent-mode HTS shim coil of claim 1, further comprising a second rectangular thin sheet of HTS resulting in two identical loops, where the loops are energized in opposite directions.

9. The persistent-mode HTS shim coil of claim 1, further comprising a second, third, and fourth rectangular thin sheet of HTS resulting in four identical loops, where the four loops are connected in series, and energized simultaneously.

10. The persistent-mode HTS shim coil of claim 1, wherein the HTS shim coil is part of in a superconducting magnet that operates above liquid helium temperatures.

11. A superconducting magnet assembly having at least one persistent-mode High Temperature Superconductor (HTS) shim coil, wherein the assembly comprises:
    at least one superconducting magnet for providing very strong magnetic field ranges of greater than approximately 12 Tesla (T) within a center-portion of the superconducting magnet;
    at least one corrective coil; and
    the persistent-mode HTS shim coil being located within a center-portion of the superconducting magnet, wherein the HTS shim comprises at least one rectangular shaped thin sheet of HTS having:
        a first long portion;
        a second long portion parallel to the first long portion;
        a first end; and
        a second end parallel to the first end,
            wherein the rectangular shaped thin sheet of high-temperature superconductor has a hollow center and forms a continuous loop,
            wherein the first end and the second end are folded toward each other forming two rings, and
            wherein the thin sheet of high-temperature superconductor has a radial build that is less than 5 millimeters (mm) and able to withstand the very strong magnetic field ranges of greater than approximately 12 Tesla (T) within the center-portion of the superconducting magnet.

12. The superconducting magnet assembly of claim 11, wherein the superconducting magnet operates above liquid helium temperatures.

13. The superconducting magnet assembly of claim 11, wherein the superconducting magnet is selected from the group consisting of a Nuclear Magnetic Resonance (NMR) magnet and a Magnetic Resonance Imaging (MRI) magnet.

14. The superconducting magnet assembly of claim 11, further comprising an exterior shim located external to the superconducting magnet.

15. The superconducting magnet assembly of claim 11, wherein the rectangular thin sheet is a rare earth metal combined with Barium Copper Oxide (BCO).

16. The superconducting magnet assembly of claim 15, wherein the rare earth metal is Yttrium.

17. The superconducting magnet assembly of claim 11, wherein the HTS shim coil further comprises more than one rectangular shaped thin sheet of HTS comprised in a larger diameter HTS shim coil.

18. The superconducting magnet assembly of claim 11, wherein the two rings each have a diameter of 2 multiplied by the radius of the ring and the distance between the rings is $\sqrt{3}$ multiplied by the radius of the ring.

19. The superconducting magnet assembly of claim 11, wherein the first end and the second end overlap each other so that ±z directed current vectors are nearly cancelled.

20. The superconducting magnet assembly of claim 18, wherein the two rings are energized in the opposite direction.

21. The superconducting magnet assembly of claim 11, wherein the HTS shim coil further comprises a second rectangular thin sheet of HTS resulting in two identical loops, where the loops are energized in opposite directions.

22. The superconducting magnet assembly of claim 11, wherein the HTS shim coil further comprising a second, third, and fourth rectangular thin sheet of HTS resulting in four identical loops, where the four loops are connected in series, and energized simultaneously.

* * * * *